United States Patent
Mizuno et al.

(10) Patent No.: US 8,203,808 B2
(45) Date of Patent: Jun. 19, 2012

(54) MAGNETO-RESISTANCE EFFECT ELEMENT INCLUDING FREE LAYER HAVING MULTILAYER CONSTITUTION INCLUDING MAGNETIC BODY MIXED WITH ELEMENT HAVING 4F ELECTRONS

(75) Inventors: Tomohito Mizuno, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 926 days.

(21) Appl. No.: 11/927,486

(22) Filed: Oct. 29, 2007

(65) Prior Publication Data

US 2008/0100969 A1    May 1, 2008

(30) Foreign Application Priority Data

Oct. 30, 2006 (JP) ................. 2006-294527

(51) Int. Cl.
  *G11B 5/39*  (2006.01)
(52) U.S. Cl. ................... 360/324.12
(58) Field of Classification Search ........... 360/324.12
    See application file for complete search history.

(56) References Cited

U.S. PATENT DOCUMENTS

| 6,400,536 | B1 * | 6/2002 | Gill .................. 360/324.12 |
| 2005/0184839 | A1 * | 8/2005 | Nguyen et al. ............. 335/173 |
| 2006/0092696 | A1 | 5/2006 | Bessho |
| 2006/0221512 | A1 * | 10/2006 | Gill et al. ............... 360/324.12 |
| 2006/0291108 | A1 * | 12/2006 | Sbiaa et al. ............. 360/324.12 |
| 2007/0086121 | A1 * | 4/2007 | Nagase et al. ............ 360/324.1 |

FOREIGN PATENT DOCUMENTS

| JP | 2001-28466 A | 1/2001 |
| JP | 2003-110167 A | 4/2003 |
| JP | 2003-218428 | 7/2003 |
| JP | 2005-294453 | 10/2005 |
| JP | 2006-128579 A | 5/2006 |
| JP | 2006-237154 A | 9/2006 |
| JP | 2006-269866 A | 10/2006 |
| WO | WO 2005101378 A1 * | 10/2005 |

OTHER PUBLICATIONS

William Bailey et al., "Control of Magnetization Dynamics in Ni81Fe19 Thin Films Through the Use of Rare-Earth Dopants", Jul. 2001, IEEE Transactions on Magnetics, vol. 37, No. 4, pp. 1749-1754.*
Stephen E. Russek, et al., Magnetostriction and angular dependence of ferromagnetic resonance linewidth in Tb-doped Ni0.8Fe0.2 thin films, Journal of Applied Physics, vol. 91, No. 10, May 15, 2002, pp. 8659-8661.
Office Action dated Feb. 26, 2009 in Corresponding Japanese Application No. 2006-294527.

* cited by examiner

*Primary Examiner* — Angel A. Castro
(74) *Attorney, Agent, or Firm* — Knobbe Martens Olson & Bear LLP

(57) ABSTRACT

In an MR element constituted in such a manner that a pinned layer whose magnetization direction is fixed, a nonmagnetic spacer layer, and a free layer whose magnetization direction is changed according to an external magnetic field, are laminated in this order; the free layer has a multilayer constitution including a magnetic body mixed with an element having 4f electrons at a certain ratio. Specifically, the first layer in contact with the spacer layer, the third layer, the fifth layer, and the seventh layer of the free layer are formed by mixing Nd, Sm, Gd, or Tb into CoFe. The second layer and the sixth layer of the free layer are formed by mixing Nd, Sm, Gd, or Tb into NiFe. The third layer of the free layer is Cu. A damping constant of the free layer is greater than 0.018.

9 Claims, 14 Drawing Sheets

MAGNETO-RESISTANCE EFFECT ELEMENT INCLUDING FREE LAYER HAVING MULTILAYER CONSTITUTION INCLUDING MAGNETIC BODY MIXED WITH ELEMENT HAVING 4F ELECTRONS

BACKGROUND OF THE INVENTION

1. Field of the Invention

The present invention relates to a magneto-resistance effect element, a thin film magnetic head, and the like, which are suitably used for a hard disk drive.

2. Description of the Related Art

Hard disk drives employ a thin-film magnetic head having a magneto-resistance effect element (MR element) for reading magnetic signals. In recent years, efforts have been made to design hard disk drives for higher recording densities, and accordingly there are growing demands for thin-film magnetic heads, particularly magneto-resistance effect elements, which satisfy higher-sensitivity and higher-output requirements.

A CIP-GMR (Current in Plane-Giant Magneto-resistance) element which is a giant magneto-resistance effect element having a nonmagnetic layer between ferromagnetic layers and passing a sensing current in parallel to a layer surface, has been conventionally developed as a reproducing element in a thin-film magnetic head. On the other hand, a magnetic head that uses a TMR (Tunnel Magneto-resistance) element which has an insulation layer instead of the nonmagnetic layer as an intermediate layer and which passes a sensing current perpendicular to a layer surface, has also been developed in order to achieve higher densification. Furthermore, a magnetic head that uses a CPP (Current Perpendicular to Plane)-GMR element which is a GMR element having a nonmagnetic layer as the intermediate layer and passing a sensing current perpendicular to the layer surface similar to the TMR element, has also been developed. CPP-GMR element has an advantage of having low resistance in comparison with the TMR element and having higher output in a narrower track width than the CIP-GMR element.

An ordinary GMR element is interposed between the upper shield layer and the lower shield layer which also function as electrode films respectively, and such a GMR element is also referred to as a spin valve film (SV film). The GMR element is in the cylindrical shape of a desired size, and has a structure interposing a non-magnetic spacer layer between a pinned layer which is a ferromagnetic layer in which the magnetization direction is fixed and a free layer which is a ferromagnetic layer in which the magnetization direction varies according to an external magnetic field. A pinned layer is provided on an antiferromagnetic layer, whereby the magnetization direction of the pinned layer is fixed. Recently, there has been developed a CPP-GMR element in which an exchange coupling force from antiferromagnetic layers is effectively increased in such a manner that a pinned layer is formed not into a single-layer constitution of ferromagnetic material but into a three-layer constitution (synthetic pinned layer) consisting of a ferromagnetic layer (inner layer)/a nonmagnetic metal layer (nonmagnetic intermediate layer)/a ferromagnetic layer (outer layer), thereby imparting strong exchange coupling between the two ferromagnetic layers.

A hard magnetic film (hard bias film) made of CoPt or CoCrPt is provided around the CPP-GMR element via an insulation film such as $Al_2O_3$. The hard bias film is a film which is positioned at the side of the CPP-GMR element in the track width direction in order to control the magnetic domain of a free layer. A cap layer and a buffer layer are provided in the upper and lower ends of the CPP-GMR element, respectively. Thus, the CPP-GMR element is constituted so as to be inserted between an upper shield layer and a lower shield layer.

As disclosed in Japanese Patent Application Laid-Open No. 2005-294453, a NiFe alloy layer or a CoFe alloy layer is conventionally used as the free layer of the CPP-GMR element.

In recent years, according to an increase in the recording density of a hard disk drive, miniaturization of the CPP-GMR element has been advanced, so that the size of the CPP-GMR element may become 0.1 μm×0.1 μm or less in the top view. Such reduction in the size of the planar shape causes the current density to be increased to about $10^{-7}$ ($A/cm^2$) or more. When the current density is increased, there arises a problem that spin transfer torque is generated to suppress the output of the magneto-resistance effect element.

SUMMARY OF THE INVENTION

Accordingly, it is an object of the present invention to provide a magneto-resistance effect element capable of suppressing the influence of spin transfer torque and of obtaining a sufficient output, and to provide a thin film magnetic head, a substrate, a wafer, a head gimbals assembly, and a hard disk drive, which include the magneto-resistance effect element.

A magneto-resistance effect element of the present invention which is formed in such a manner that a pinned layer whose magnetization direction is fixed, a nonmagnetic spacer layer, and a free layer whose magnetization direction is changed according to an external magnetic field, are laminated so as to make the spacer layer positioned between the pinned layer and the free layer, is characterized in that the free layer has a multilayer constitution including a magnetic body mixed with an element having 4f electrons, and the free layer has a portion which is in contact with the spacer layer and which is made of a layer containing CoFe.

In this constitution, since an element having 4f electrons is mixed into the free layer, the torque caused by the spin inversion of conduction electrons is applied to the element having 4f electrons, so that the magnetic body as the base body of the free layer is hardly influenced by the torque. The magnetization of the free layer is mainly determined not by the element having 4f electrons but by the magnetic body. Therefore, when the magnetic body is hardly influenced by the torque, magnetization of the free layer is hardly changed, and magnetization inversion is suppressed. Further, the layer containing CoFe is excellently grown on the spacer layer, thereby enabling the free layer to be excellently formed.

The element having 4f electrons may be at least one of the following: Nd, Sm, Gd, and Tb. The magnetic body may be a NiFe alloy or a CoFe alloy.

It is preferable that the ratio of Ni in the NiFe alloy be greater than or equal to 70 at. % and less than 100 at. %, and that the ratio of Co in the CoFe be greater than 0 at. % and less than or equal to 70 at. %. Further, it is preferable that the element having 4f electrons be mixed into the magnetic body at a ratio greater than or equal to 2 at. % and less than or equal to 25 at. %. It is also preferable that the damping constant of the free layer be greater than 0.018. According to the above described constitution, it is possible to make the magnetization inversion critical current larger than the current density based on an external magnetic field applied to the magneto-resistance effect element under general conditions, and to thereby attain high reliability in suppressing the occurrence of magnetization inversion in the free layer during ordinary use.

A thin film magnetic head according to the present invention has a magneto-resistance effect element constituted as described above, and a substrate according to the present invention has the thin film magnetic head. A wafer according to the present invention is used for manufacturing the substrate having the above described constitution, and is provided with at least one of the thin film magnetic heads constituted as described above. Further, a head gimbal assembly according to the present invention has a slider which includes the substrate having the above described constitution and which is arranged opposite a recording medium, and has a suspension to elastically support the slider. Further, a hard disk drive according to the present invention has a slider which includes the substrate having the above described constitution and which is arranged opposite a rotatably driven disc-shaped recording medium, and has a positioning device to support the slider and to position the slider with respect to the recording medium.

According to the present invention, in the magneto-resistance effect element, it is possible to suppress magnetization inversion of the free layer resulting from the spin transfer torque, and to obtain a sufficient output.

The above and other objects, features and advantages of the present invention will become apparent from the following description with reference to the accompanying drawings which illustrate examples of the present invention.

DETAILED DESCRIPTION OF THE PREFERRED EMBODIMENTS

Hereinafter, embodiments of the present invention will be described below with reference to the drawings.

[Configuration of Thin-Film Magnetic Head]

Figure 1:
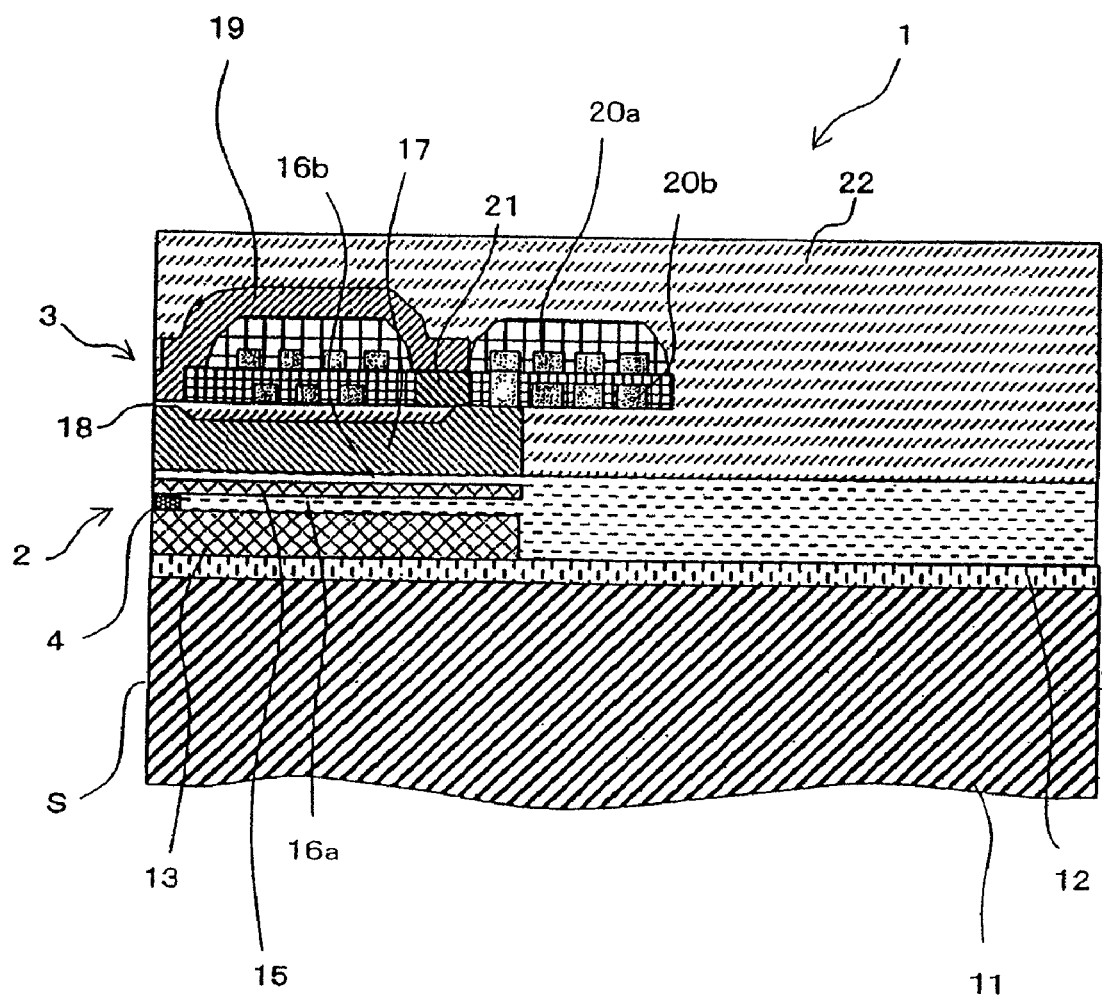
FIG. 1 is a cross-sectional view of a major portion of a thin film magnetic head according to an embodiment of the present invention.

FIG. 1 conceptually shows a cross-sectional view of a major portion of a thin-film magnetic head according to an embodiment of the present invention.

Thin-film magnetic head 1 according to the present embodiment has substrate 11, reproducing unit 2 which reads data from a recording medium (not shown) and which is formed on substrate 11, and recording unit 3 for writing data on a recording medium (not shown) and which is formed on substrate 11.

Substrate 11 is made of $Al_2O_3 \cdot TiC$ (AlTiC) that has excellent wear resistance. Base layer 12 made of alumina is disposed on an upper surface of substrate 11, and reproducing unit 2 and recording unit 3 are stacked on base layer 12.

Lower shield layer 13 made of a magnetic material such as Permalloy (NiFe), for example, is disposed on base layer 12. CPP-GMR element 4 which is a magneto-resistance effect element (hereinafter, simply referred to as "MR element") is disposed on lower shield layer 13 at an end thereof near surface S (FIG. 13) and has an end exposed on surface S to face a recording medium. First upper shield layer 15 made of a magnetic material such as Permalloy, for example, is disposed on MR element 4. Lower shield layer 13, MR element 4, and first upper shield layer 15 jointly make up reproducing unit 2. Insulating layer 16a is primarily disposed in a region between lower shield layer 13 and first upper shield layer 15 which is without MR element 4. MR element 4 is also referred to as an SV film (spin valve film).

Lower magnetic pole layer 17 made of a magnetic material such as Permalloy or CoNiFe is disposed on first upper shield layer 15 with insulating layer 16b interposed therebetween. Lower magnetic pole layer 17 functions as a lower magnetic pole layer of recording unit 3 and also as a second upper shield layer of MR element 4.

Upper magnetic pole layer 19 is disposed on lower magnetic pole layer 17 which functions as a second upper shield layer, with recording gap layer 18 interposed therebetween which is made of a nonmagnetic material such as Ru or alumina. Recording gap layer 18 is disposed on lower magnetic pole layer 17 at an end thereof near surface S to face a recording medium and has an end exposed on surface S to face a recording medium. Upper magnetic pole layer 19 is made of a magnetic material such as Permalloy or CoNiFe. Lower magnetic pole layer (second upper shield layer) 17 and upper magnetic pole layer 19 are magnetically connected to each other by connector 21, and they make up a magnetic circuit as a whole.

Coils 20a, 20b made of an electrically conductive material such as copper are disposed as two layers between lower magnetic pole layer 17 and upper magnetic pole layer 19 and also between surface S to face a recording medium and connector 21. Each of coils 20a, 20b serves to supply magnetic fluxes to lower magnetic pole layer 17 and upper magnetic pole layer 19 and has a planar spiral shape surrounding connector 21. Coils 20a, 20b are insulated from the surrounding region by an insulating layer. Though coils 20a, 20b in the two layers are illustrated in this embodiment, they are not limited to the two layers, but may be in one layer or three or more layers.

Overcoat layer 22 is disposed in covering relation to upper magnetic pole layer 19, and protects the structure described above. Overcoat layer 22 is made of an insulating material such as alumina, for example.

[Configuration of MR Element]

Figure 2A:
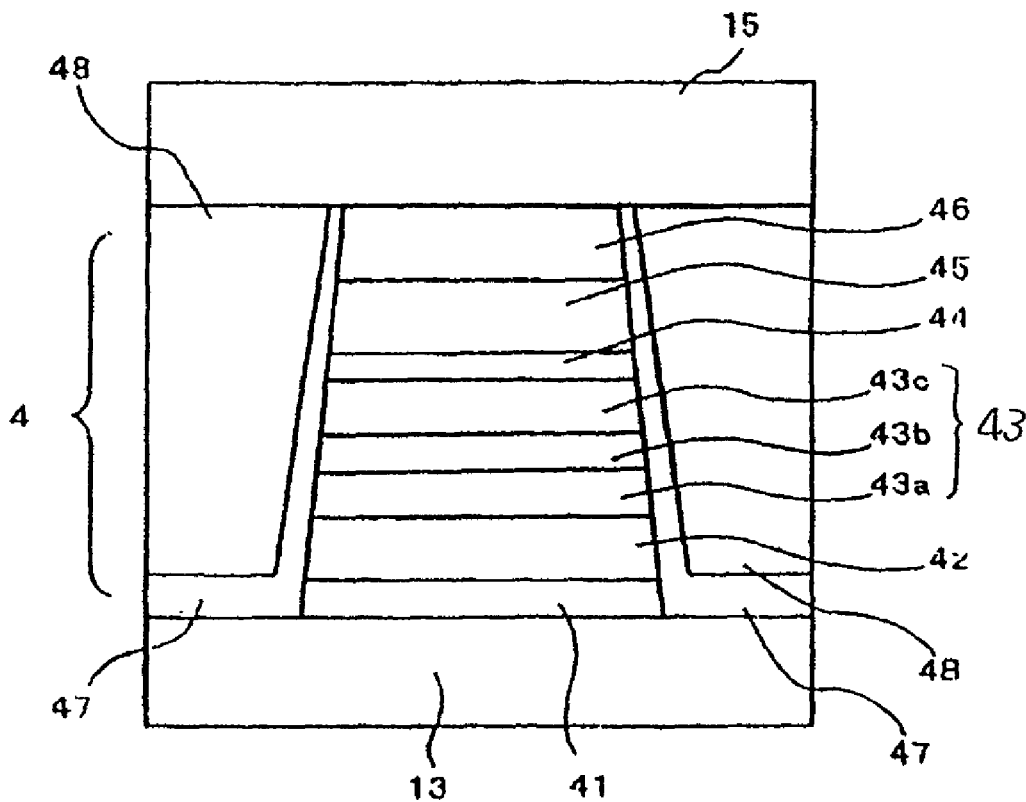
FIG. 2A is a view of an MR element shown in FIG. 1 as viewed from its surface to face a recording medium.

Next, MR element 4 (SV film) will be described in detail below with reference to FIG. 2, which is a view of MR element 4 as viewed from surface S to face a recording medium.

As described above, MR element 4 is interposed between lower shield layer 13 and upper shield layer 15. MR element 4 has a structure comprising buffer layer 41, antiferromagnetic layer 42, pinned layer 43, spacer layer 44, free layer 45, and cap layer 46 which are stacked successively in this order from the side of lower shield layer 13. In the embodiment shown in FIG. 2A, pinned layer 43 has a structure wherein nonmagnetic intermediate layer 43b is interposed between outer layer 43a and inner layer 43c each made of a ferromagnetic material. Pinned layer 43 having such a structure is referred to as a synthetic pinned layer. Outer layer 43a is held in contact with antiferromagnetic layer 42, and inner layer 43c is held in contact with spacer layer 44.

Lower shield layer 13 and upper shield layer 15 serve as electrodes, respectively. A sensing current flows in a direction orthogonal to the layer surface through lower shield layer 13 and upper shield layer 15 of MR element 4. Lower shield layer 13 and upper shield layer 15 comprise NiFe films having a thickness of about 2 μm or less. One example of materials and thicknesses of the respective layers is shown in Table 1.

TABLE 1

|  |  | material | thickness (nm) |
|---|---|---|---|
|  | Cap layer 46 | Ru | 10.0 |
| Free layer 45 | Seventh layer 45g | CoFe—X | 1.0 |
|  | Sixth layer 45f | NiFe—X | 2.0 |
|  | Fifth layer 45e | CoFe—X | 0.5 |
|  | Fourth layer 45d | Cu | 0.2 |
|  | Third layer 45c | CoFe—X | 0.5 |
|  | Second layer 45b | NiFe—X | 2.0 |
|  | First layer 45a | CoFe—X | 1.0 |
|  | Spacer layer 44 | Cu | 3.0 |
| Pinned layer 43 | Inner layer 43c | CoFe | 1.0 |
|  |  | $Co_2MnSi$ | 4.0 |
|  |  | CoFe | 1.0 |
|  | Nonmagnetic intermediate layer 43b | Ru | 0.4 |
|  | Outer layer 43a | CoFe | 5.0 |
|  | Antiferromagnetic layer 42 | IrMn | 7.0 |
|  | Buffer layer 41 | NiCr | 5.0 |
|  |  | Ta | 1.0 |

A combination of materials in which exchange coupling between anti-ferromagnetic layer 42 and outer layer 43a of pinned layer 43 becomes favorable is selected as a material of buffer layer 41. Buffer layer 41 comprises a laminated layer of Ta/NiCr or the like. Incidentally, in the present specification, m showing a multi-layer structure means that the layer of the left side of "/" is a layer lower than the layer of the right side of "/", that is, a layer formed earlier.

Anti-ferromagnetic layer 42 plays a role of fixing the magnetization direction of pinned layer 43, and for example, comprises a IrMn film that has a thickness of 7.0 nm.

Pinned layer 43 is formed as a magnetic layer, and has a constitution in which outer layer 43a, nonmagnetic intermediate layer 43b, and inner layer 43c are stacked in this order, as described above. Outer layer 43a whose magnetization direction is fixed by antiferromagnetic layer 42 with respect to an external magnetic field, is made of, for example, a Co70Fe30 film having a thickness of 5.0 nm. The description such as "Co70Fe30", which is a more detailed representation of "CoFe" or the like, represents the atomic fraction of each element by percentage and means, for example, a layer containing Co by 70% and Fe by 30%. Nonmagnetic intermediate layer 43b is constituted by, for example, a Ru film having a thickness of 0.4 to 0.8 nm. Inner layer 43c is a ferromagnetic layer and a layer consisting of, for example, Co70Fe30/$Co_2MnSi$/Co30Fe70. In the synthetic pinned layer constituted in this manner, the magnetic moment of outer layer 43a and the magnetic moment of inner layer 43c are mutually cancelled, so that the leakage magnetic field is suppressed as a whole and the magnetization direction of inner layer 43c is firmly fixed.

Spacer layer 44 is made of a non-magnetic material, and is constituted by, for example, a Cu layer having a thickness of 3.0 nm.

Figure 2B:
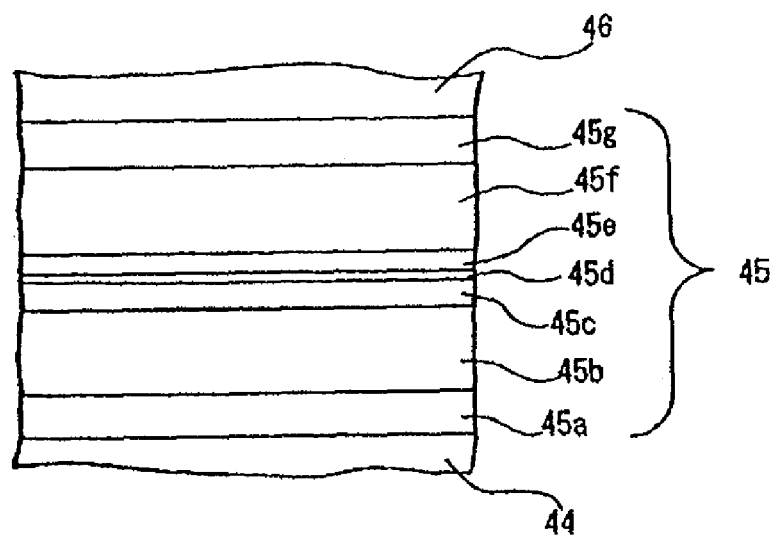
FIG. 2B is an enlarged view near the free layer in FIG. 2A.

The magnetization direction of free layer 45 is changed according to an external magnetic field. Free layer 45 according to the present invention has a multilayer constitution including a magnetic body mixed with at least an element having 4f electrons. Specifically, free layer 45 consists of, for example, (CoFe—X)/(NiFe—X)/(CoFe—X)/Cu/(CoFe—X)/(NiFe—X)/(CoFe—X). Here, "-X" represents that X is added, and X represents an element having 4f electrons. That is, free layer 45 has a multilayer constitution in which, for example as shown in FIG. 2B, first layer (CoFe—X film) 45a having a thickness of 1.0 nm, first layer (NiFe—X film) 45b having a thickness of 2.0 nm, third layer (CoFe—X film) 45c having a thickness of 0.5 nm, fourth layer (Cu film) 45d having a thickness of 0.2 nm, fifth layer (CoFe—X film) 45e having a thickness of 0.5 nm, sixth layer (NiFe—X film) 45f having a thickness of 2.0 nm, seventh layer (CoFe—X film) 45g having a thickness of 1.0 nm are laminated in this order. X is preferably one of the following: Nd, Sm, Gd, and Tb. The effect of free layer 45 will be described below.

Cap layer 46 is provided to prevent deterioration of MR element 4, and is made of Ru having a thickness of 10.0 nm, for example.

Hard bias films 48 are disposed on opposite sides (right and left sides in FIG. 2) of MR element 4 in a track width direction [an in-plane direction of each of the layers of MR element 4 within a plane parallel to surface S to face a recording medium (see FIG. 1)], with insulating films 47 interposed therebetween. Hard bias films 48 apply a biasing magnetic field in the track width direction to free layer 45 to turn free layer 45 into a single magnetic domain. Hard bias films 48 are made of a hard magnetic material such as CoPt, CoCrPt, or the like, for example. Insulating films 47 serve to prevent the sensing current from leaking into hard bias films 48, and may be in the form of an oxide film of $Al_2O_3$, for example. Insulating films 47 may be a part of insulating layer 16a.

[Constitution and Effect of Free Layer]

The constitution and the effect of free layer 45 which is the most characteristic constitution in the present embodiment will be described. Free layer 45 according to the present invention has a multilayer constitution containing an element having 4f electrons. First layer 45a in contact with the spacer layer is made of a layer containing CoFe. As an example, free layer 45 has a seven-layer constitution consisting of (CoFe—X)/(NiFe—X)/(CoFe—X)/Cu/(CoFe—X)/(NiFe—X)/

(CoFe—X), as described above. It is preferable that X be one of the following: Nd, Sm, Gd, and Tb. The use of free layer 45, as described above, makes it possible to suppress the influence of spin transfer torque in MR element 4. This point will be described below.

First, the spin transfer torque taken as a problem in the present invention will be described. When spin polarized conduction electrons are injected into a magnetic layer, the injected conduction electrons make the spin in the magnetic layer rotate to the same direction as the spin direction of the conduction electrons. This phenomenon of rotating the spin in the magnetic layer is referred to as spin transfer torque. Spin transfer torque results in fluctuation of the magnetized state of the magnetic layer, and may cause magnetization inversion in some cases. Such spin transfer torque may be used effectively in the case where it is preferable to cause magnetization inversion in an MRAM and the like. However, in the case of a reproducing element of a thin film magnetic head, the magnetization direction of the free layer may be determined by a factor other than a recording medium, and hence the spin transfer torque is not preferable.

Specific spin transfer torque in the CPP-GMR element will be described. As described above, in MR element 4 formed by laminating pinned layer 43, spacer layer 44, and free layer 45, when a current is made to flow to enable conduction electrons to pass from pinned layer 43 to free layer 45, conduction electrons in the spin state parallel to the magnetization direction of pinned layer 43 easily pass through pinned layer 43. However, conduction electrons in the spin state anti-parallel to the magnetization direction of pinned layer 43 cannot pass through pinned layer 43 and are reflected. That is, pinned layer 43 acts as a spin filter. As a result, only conduction electrons in the spin state parallel to the magnetization direction of pinned layer 43 are made to flow into spacer layer 44. In this way, conduction electrons in the spin polarized state are made to pass through spacer layer 44 and injected into free layer 45. When conduction electrons in the spin polarized state are injected into free layer 45 whose magnetization direction is not fixed, spin transfer torque is applied so as to make the spin direction of the magnetic body of free layer 45 coincident with the spin direction of the injected conduction electrons. When the amount of conduction electrons in the spin polarized state, which are injected in this way, is large, fluctuation of the magnetization is caused in free layer 45, and magnetization inversion may be caused in some cases. That is, conduction electrons, which are subjected to spin inversion and to which torque is applied while being electrically conducted in MR element 4, interact with 3d electrons of the magnetic body (for example, a CoFe alloy or a NiFe alloy) constituting free layer 45, so that magnetization of the magnetic body itself is influenced by the torque of the conduction electrons. This causes magnetization inversion in free layer 45.

When MR element 4 is used as a reproducing element of thin film magnetic head 1, the magnetization direction of free layer 45 is determined according to an external magnetic field, that is, magnetism recorded in a magnetic recording medium, so that the records of the magnetic recording medium can be read by detecting the magnetization direction. However, when magnetization inversion is caused by the injection of the conduction electrons in the spin polarized state into free layer 45 as described above, it becomes difficult to detect the external magnetic field (the magnetism from the magnetic recording medium). This causes the sensitivity of a reproducing element of thin film magnetic head 1 to be deteriorated, and, in the worst case, makes thin film magnetic head 1 unable to be used.

Thus, in order to prevent magnetization inversion from being caused in free layer 45 of MR element 4, an element (for example, Nd, Sm, Gd, or Tb) having 4f electrons is mixed into the magnetic body (for example, a CoFe alloy or a NiFe alloy) constituting free layer 45 in the present invention. In this case, conduction electrons to which torque is applied mainly interact with the 4f electrons instead of the 3d electrons of the magnetic body of free layer 45. Further, if the constitution is adapted to prevent the element having 4f electrons from influencing the magnetization of free layer 45, that is, if the magnetization of free layer 45 does not depend on the element having 4f electrons but it depends on the magnetic body having 3d electrons, even when the torque due to the spin inversion of the conduction electrons is applied to 4f electrons, the influence of the torque is not exerted on the magnetization of free layer 45. Therefore, it is conceivable that magnetization inversion of free layer 45 is not caused or is reduced.

In this way, according to the present invention, an element having 4f electrons to which the torque due to spin inversion of the conduction electrons will be applied, is previously mixed into the magnetic body constituting free layer 45 to such an extent that is not responsible for the magnetization of free layer 45 (the extent of hardly affecting the magnetization of free layer 45), thereby preventing spin transfer torque from affecting the magnetization of free layer 45. Therefore, it is possible to prevent spin transfer torque from causing magnetization inversion of free layer 45, and to thereby make MR element 4 exhibit the inherent output performance. This is the main feature of the present invention.

Figure 3:
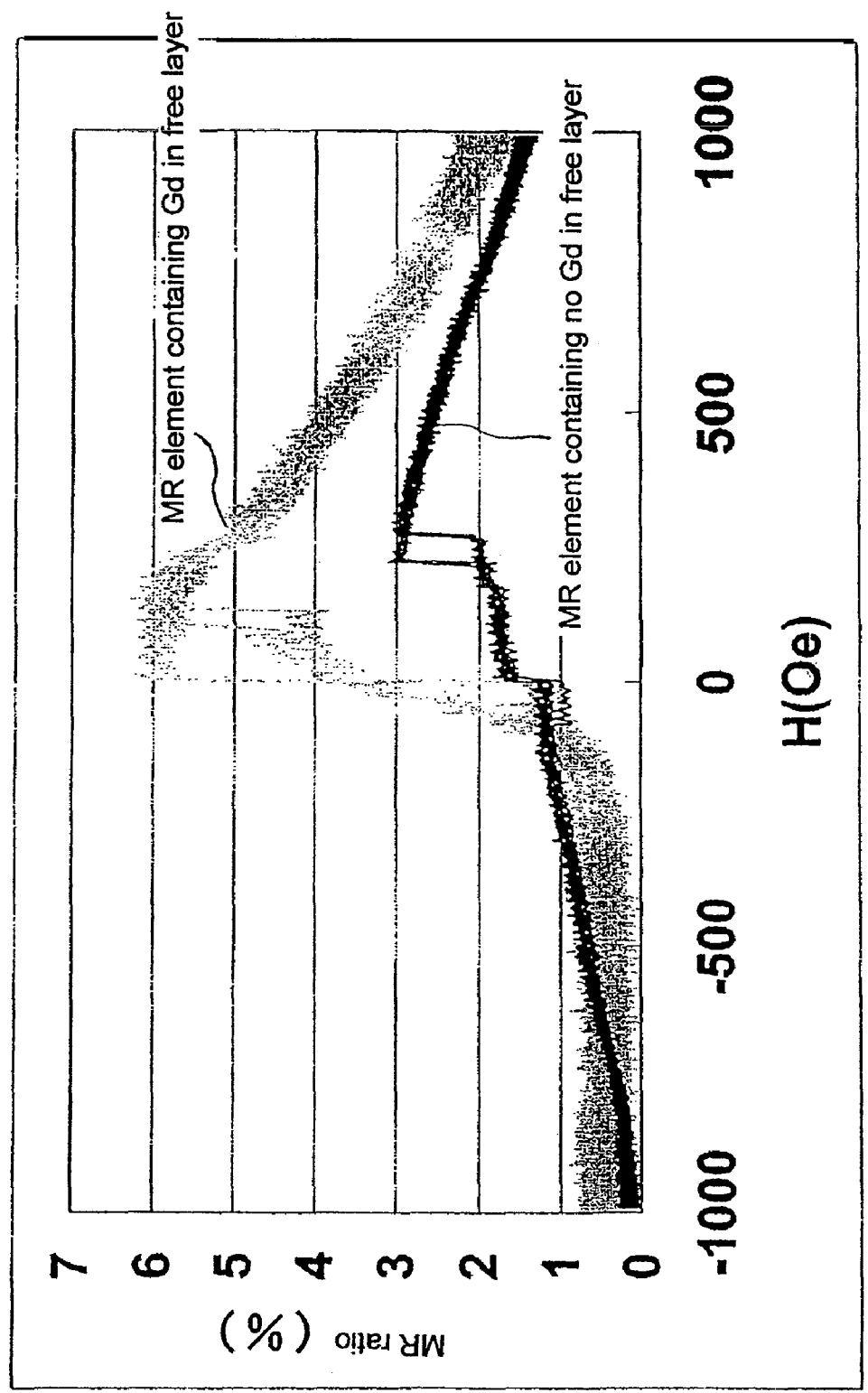
FIG. 3 is a graph showing the relationship between the external magnetic field and the MR ratio of an MR element containing Gd in the free layer, and the relationship between the external magnetic field and the MR ratio of an MR element not containing Gd in the free layer.

As an example, there is shown in FIG. 3 a comparison between MR element 4 provided with free layer 45 having a constitution in which Gd, an element having 4f electrons, is mixed in a Co30Fe70 alloy as a magnetic body, and a conventional MR element provided with a free layer made only of a Co30Fe70 alloy. It can be seen from FIG. 3 that in MR element 4 provided with free layer 45 containing Gd, it is possible to obtain a large MR ratio as compared with the MR ratio in the conventional MR element, in particular, in the range of magnitude H of externally applied magnetic field from 0 to 1000 [Oe] (=0 to 79577 [A/m]).

The technical significance of mixing the element having 4f electrons into the magnetic body in free layer 45 will be described in more detail.

As described above, the problem of the conventional MR element is that magnetization inversion of free layer 45 is caused due to the influence of spin transfer torque, and thereby it becomes impossible to high sensitively detect an external magnetic field. The tendency of causing magnetization inversion of free layer 45 is expressed by the magnitude of the magnetization inversion critical current. It can be said that magnetization inversion is hardly caused as the magnetization inversion critical current is large. In order to obtain the magnetization inversion critical current, first, a total of the torque applied to the free layer is calculated by following formula (1) according to the LLG (Landau Lifshitz Gilbert) formula. $S_{free}$ denotes the total spin angular momentum of free layer 45, $\gamma$ denotes the gyromagnetic ratio, $\mu$ denotes the permeability, and $\alpha$ denotes the damping constant.

$$\frac{dS_{free}}{dt} = (\gamma \cdot S_{free} \times H_{eff}) - \left(\alpha \hat{S}_{free} \times \frac{dS_{free}}{dt}\right) + divQ \quad (1)$$

$$\gamma = g\frac{\mu_0 e}{2m_e} = 2 \times (1.105 \times 10^5) \left[\frac{m}{A \cdot sec}\right]$$

Figure 4:
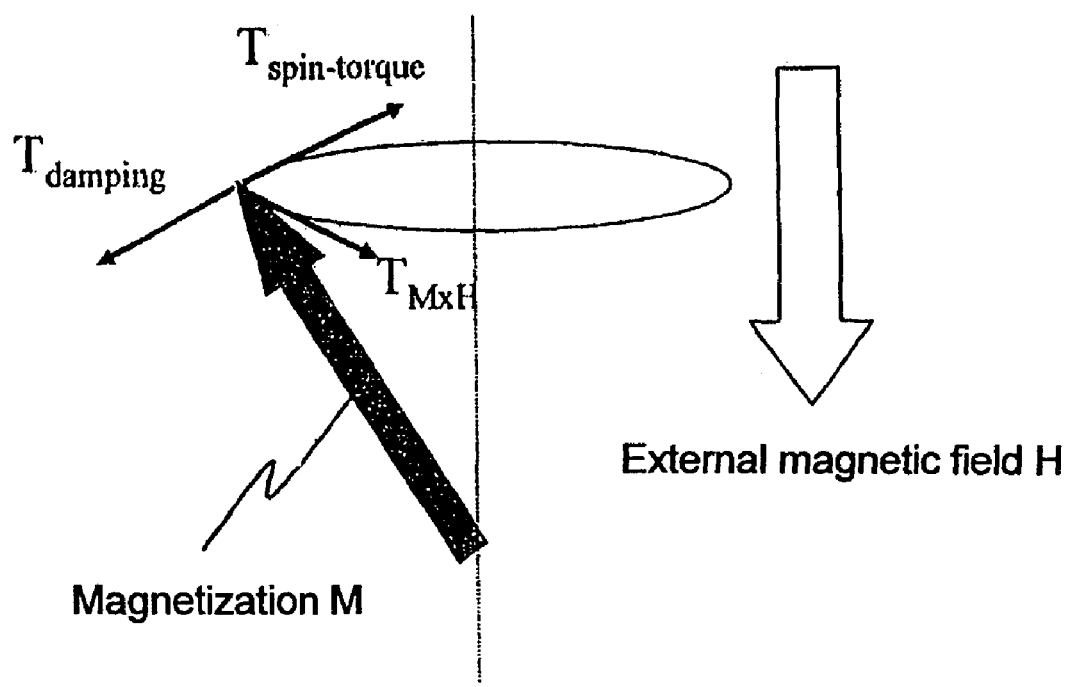
FIG. 4 is a schematic diagram showing the relationship between the external magnetic field, the magnetization of the free layer, and the torque applied to the spin in the free layer.

Torque $T_{M \times H}$ between magnetization M and external magnetic field H, damping torque $T_{damping}$ which saturates magnetization M in the direction of magnetic field H, spin torque $T_{spin-torque}$ which prevents saturation of magnetization M, which are shown in FIG. 4, are as follows. The damping serves to saturate magnetization M in the direction of magnetic field H, but spin torque $T_{spin-torque}$ serves to prevent the damping from saturating magnetization M. (More strictly, the damping depends on the direction of current. In the case of the present invention, the current is made to flow from pinned layer 43 to free layer 45, so that a parallel situation can be hardly created. That is, magnetization of free layer 45 can hardly be parallel to magnetization of pinned layer 43.) $H_{eff}$ denotes the effective magnetic field (external magnetic field+ medium magnetic field+hard bias magnetic field) applied to the free layer.

$$T_{M \times H} = (\gamma \cdot S_{free} \times H_{eff})$$

$$T_{damping} = -\left(\alpha \hat{S}_{free} \times \frac{dS_{free}}{dt}\right)$$

$$T_{spin-torque} = divQ$$

Here, complete magnetization inversion of free layer 45 is caused when spin torque $T_{spin-torque}$ overcomes damping torque $T_{damping}$ which effects saturation in the direction of magnetic field H. Therefore, the requirement for magnetization inversion is that $T_{damping}$ and $T_{spin-torque}$ cancel each other out, that is, formula (2) is implemented.

$$\left(\alpha \hat{S}_{free} \times \frac{dS_{free}}{dt}\right) = divQ \quad (2)$$

Formula (2) can be rewritten as expressed by formula (3). $P_i^{Free}$ denotes spin polarizability of the free layer, I denotes current, e denotes a charge elementary quantity, and $\hbar$ denotes Planck's constant.

$$S_{free} \alpha \gamma H_{eff} = \frac{I}{e} \cdot \frac{\hbar}{2} P_i^{Free} \quad (3)$$

Then, the magnetization inversion critical current $J_{critical}$ is expressed by formula (5) on the basis of formula (4). V denotes the volume of the free layer, and $M_s$ denotes saturation magnetization of the magnetic body of the free layer.

$$s = \frac{M_3 \cdot V}{\mu_B} \cdot \frac{\hbar}{2} \quad (4)$$

$$J_{critical} = e\left(\frac{M_s \cdot t}{\mu_B}\right) \cdot \left(\frac{\alpha \gamma}{P_i^{Free}}\right) \cdot H_{eff} [A/m^2] \quad (5)$$

Spin polarizability P is defined by polarization of current through the magnetic body, and is expressed by formula (6).

$$P = \frac{I_\uparrow - I_\downarrow}{I_\uparrow + I_\downarrow} \quad (6)$$

Figure 5:
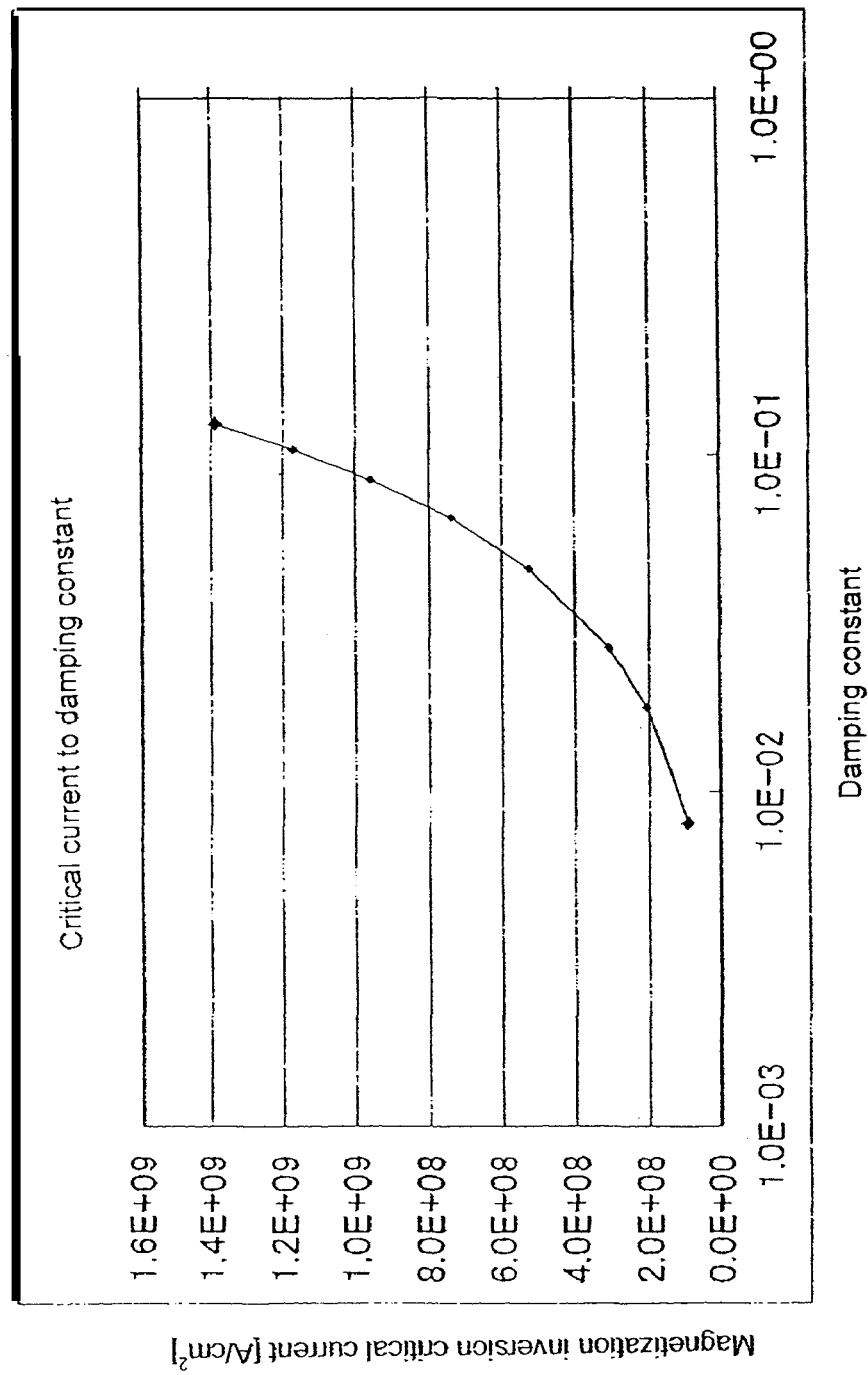
FIG. 5 is a graph showing the relationship between the damping constant of the free layer of the MR element and the magnetization inversion critical current in the free layer.

As can be seen from the above described formula (5), since magnetization inversion critical current $J_{critical}$ is proportional to damping constant $\alpha$, magnetization inversion is hardly caused as damping constant $\alpha$ is large. For example, in a Co70Fe30 film having a thickness of 6.0 nm, which is free layer 45 of a general CPP-GMR element, when the externally applied magnetic field is 500 [Oe] (=39789 [A/m]), the relationship between damping constant $\alpha$ and magnetization inversion critical current $J_{critical}$ is calculated, and the calculation result is shown in FIG. 5. It can be seen from FIG. 5 that it is preferable to increase damping constant $\alpha$ as much as possible, in order to suppress the magnetization inversion of free layer 45 as much as possible by increasing magnetization inversion critical current $J_{critical}$.

When a case where the planar shape of MR element 4 is 0.05 μm×0.05 μm and the sensing current that is made to flow through MR element 4 is 5 mA, is considered as general conditions, the current density in this case is about $2.0 \times 10^{-8}$ [A/cm$^2$]. Damping constant $\alpha$ of an ordinary CoFe alloy or NiFe alloy is about 0.008, and it can be seen from FIG. 5 that magnetization inversion critical current $J_{critical}$ in that case is about $9.1 \times 10^{-7}$ [A/cm$^2$]. This value is smaller than the current density of $2.0 \times 10^{-8}$ [A/cm$^2$] under the above described general conditions, and hence it is seen that magnetization inversion of free layer 45 is easily caused by spin transfer torque. That is, the MR element is unable to exhibit the inherent output performance. When magnetization inversion critical current $J_{critical}$ is equal to the current density of $2.0 \times 10^{-8}$ [A/cm$^2$], it is seen that damping constant $\alpha$ is about 0.018 from FIG. 5. Therefore, when damping constant $\alpha$ is 0.018 or more, it is possible, under the general conditions, to eliminate the influence of spin transfer torque and to enable MR element 4 to exhibit the inherent output performance.

As described above, it is seen that large damping constant $\alpha$ is effective in suppressing the adverse effect caused by spin transfer torque. Thus, in the present invention, damping constant $\alpha$ is increased by mixing an element having 4f electrons into free layer 45. In the document entitled "Magnetostriction and Angular Dependence of Ferromagnetic Resonance Linewidth in Tb-doped $Ni_{0.8}Fe_{0.2}$ Thin Films" (Stephen E. Riussek, et. al., Journal of Applied Physics Volume 91, Number 10, pages 8659 to 8661, American Institute of Physics, May 15, 2002), it is suggested that damping constant $\alpha$ is increased by mixing Tb or Gd into a NiFe alloy.

Figure 6:
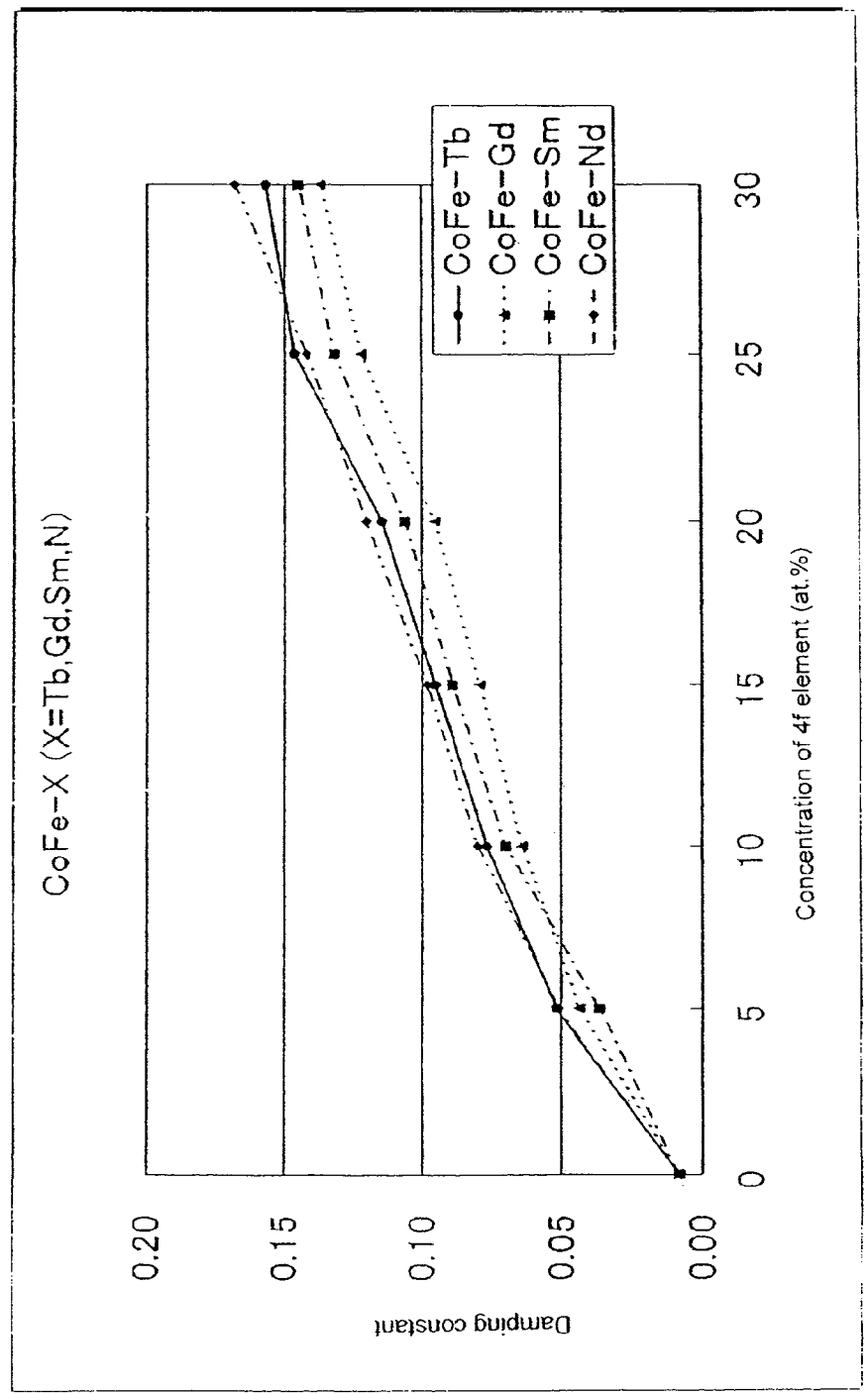
FIG. 6 is a graph showing the relationship between the concentration of elements having 4f electrons in the free layer of the MR element and the damping constant of the free layer.
Figure 7:
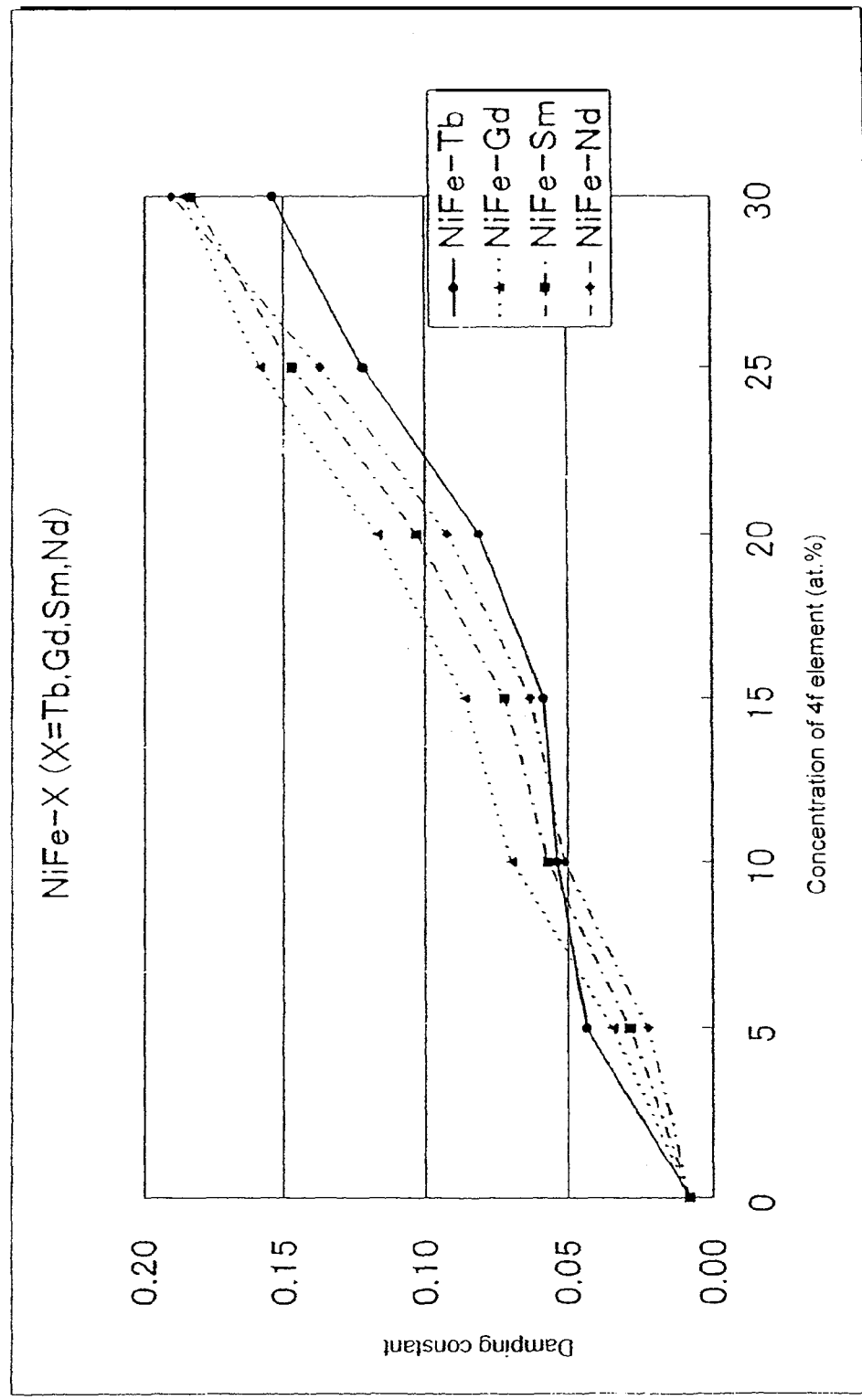
FIG. 7 is a graph showing the relationship between the concentration of elements having 4f electrons in the free layer of the MR element and the damping constant of the free layer.

Relationships between the concentration (mixing ratio) and damping constant $\alpha$ is experimentally obtained in each case where Nd, Sm, Gd, and Tb which are typical elements having 4f electrons are respectively mixed into Co70Fe30 and Ni80Fe20 which are typical magnetic bodies used for the conventional free layer, and the obtained results are shown in Tables 2, 3 and FIGS. 6, 7. It can be seen from Tables 2, 3 and FIGS. 6, 7 that almost in the same manner for any element of Nd, Sm, Gd, and Tb, damping constant $\alpha$ is increased as the concentration of the element is increased, and that damping constant $\alpha$ is 0.018 or more when the concentration is greater than or equal to about 2 at. %.

TABLE 2

| | Damping Constant | | | |
|---|---|---|---|---|
| Concentration of added X (%) | CoFe—Gd (X = Gd) | CoFe—Tb (X = Tb) | CoFe—Sm (X = Sm) | CoFe—Nd (X = Nd) |
| 0 | 0.008 | 0.008 | 0.008 | 0.008 |
| 5 | 0.043 | 0.052 | 0.036 | 0.051 |
| 10 | 0.064 | 0.077 | 0.070 | 0.080 |
| 15 | 0.079 | 0.095 | 0.089 | 0.098 |
| 20 | 0.095 | 0.114 | 0.106 | 0.120 |
| 25 | 0.122 | 0.146 | 0.132 | 0.142 |
| 30 | 0.137 | 0.157 | 0.145 | 0.168 |

TABLE 3

Damping Constant

| Concentration of added X (%) | NiFe—Tb (X = Tb) | NiFe—Gd (X = Gd) | NiFe—Sm (X = Sm) | NiFe—Nd (X = Nd) |
|---|---|---|---|---|
| 0 | 0.008 | 0.008 | 0.008 | 0.008 |
| 5 | 0.043 | 0.034 | 0.028 | 0.022 |
| 10 | 0.054 | 0.070 | 0.057 | 0.051 |
| 15 | 0.059 | 0.086 | 0.072 | 0.063 |
| 20 | 0.081 | 0.117 | 0.103 | 0.092 |
| 25 | 0.122 | 0.159 | 0.147 | 0.137 |
| 30 | 0.154 | 0.186 | 0.183 | 0.190 |

Figure 8:
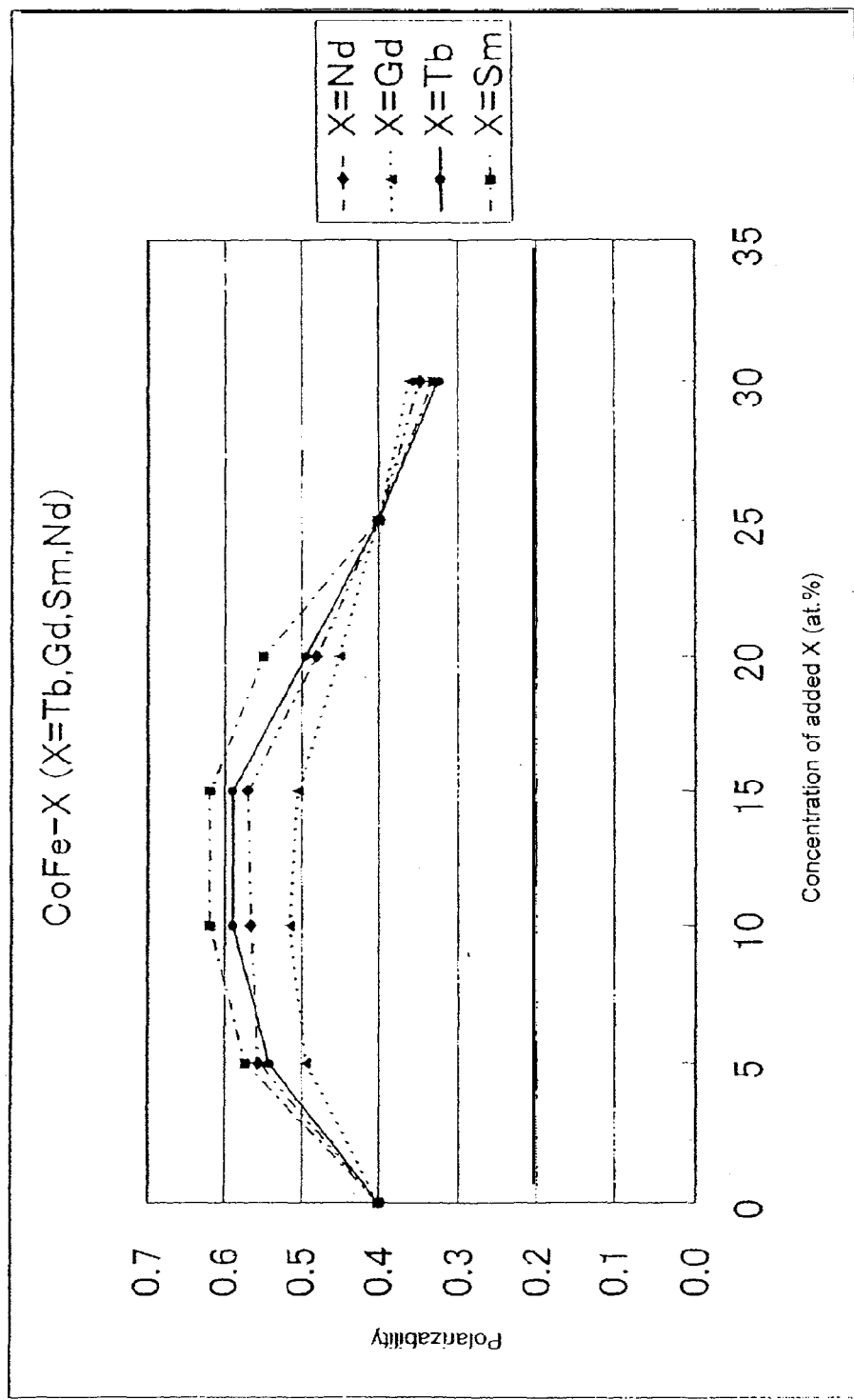
FIG. 8 is a graph showing the relationship between the concentration of elements having 4f electrons in the free layer of the MR element and polarizability of the free layer.
Figure 9:
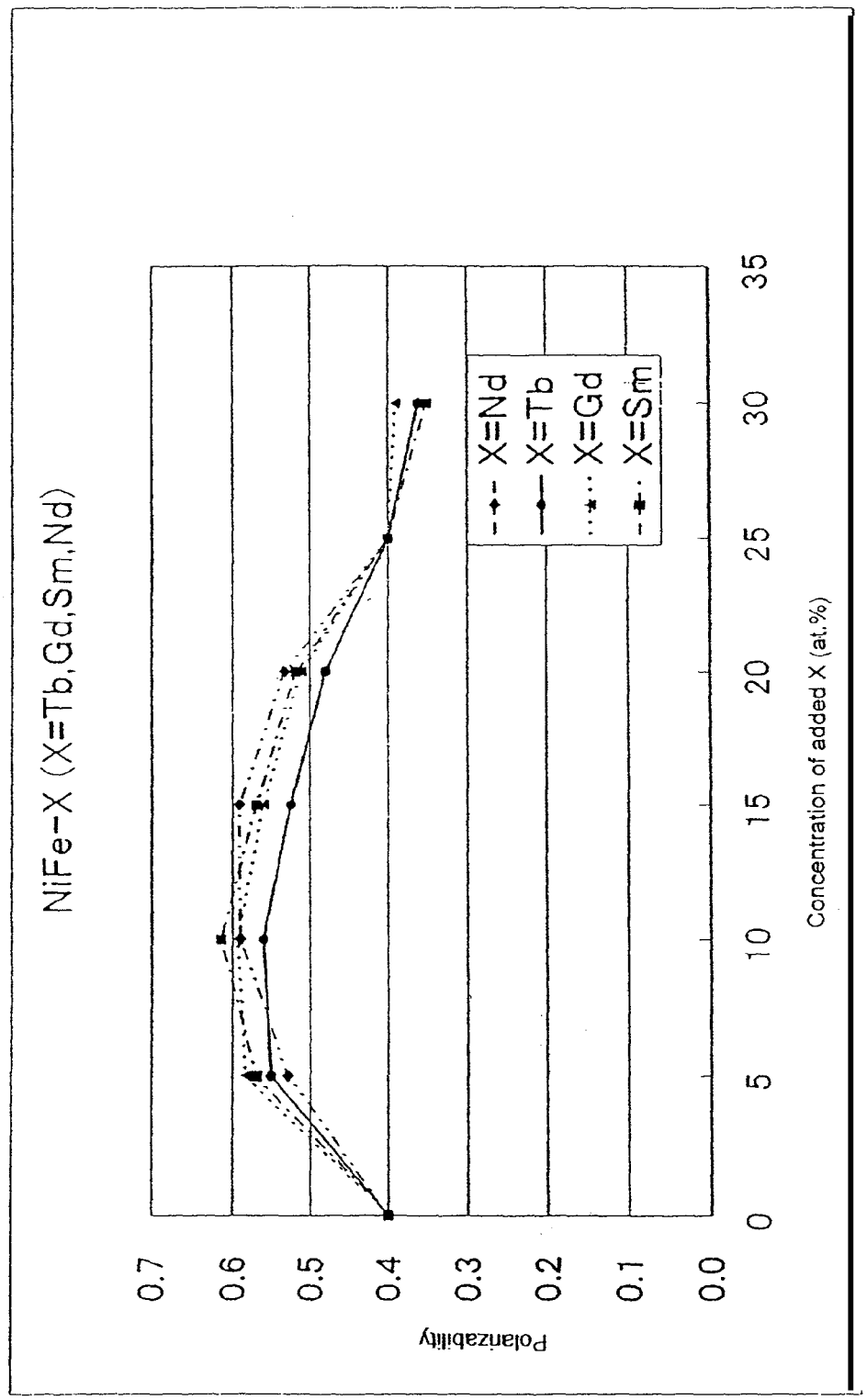
FIG. 9 is a graph showing the relationship between the concentration of elements having 4f electrons in the free layer of the MR element and polarizability of the free layer.

On the other hand, the element having 4f electrons is added as an impurity into the magnetic body which is the base body of free layer 45. Thus, when the amount of the added element having 4f electrons is too large, the element having 4f electrons reduces the polarizability of the magnetic body. Relationship between the concentration (mixing ratio) and the polarizability are experimentally obtained in each case where Nd, Sm, Gd, and Tb are respectively mixed into Co70Fe30 and Ni80Fe20, and the obtained results are shown in Tables 4, 5 and FIGS. 8, 9. It is seen from Tables 4, 5 and FIGS. 8, 9 that when any of the elements of Nd, Sm, Gd and Tb is added to the magnetic body, the polarizability is similarly increased. It is also seen that the highest polarizability is exhibited at the time when the concentration of an element having 4f electrons is about 10 at. %, and as the concentration of the element having 4f electrons is increased from this value, the polarizability is reduced. When the concentration of the element having 4f electrons is increased so that it is higher than 25 at. %, the polarizability is reduced so that it is smaller than the polarizability of 0.4 at the time when the concentration is 0, that is, at the time when an element having 4f electrons is not added. In this way, when the concentration of an element having 4f electrons is higher than 25 at. %, the polarizability is reduced so that it is smaller than the polarizability of the conventional MR element, as a result of which the MR ratio is reduced so that it is smaller than that of the conventional MR element. In this case, the ultimate purpose of the present invention of increasing the MR ratio of an MR element and of securing a sufficient output voltage of the MR element cannot be achieved, and hence it is meaningless to add an element having 4f electrons. It is seen from Tables 4, 5 and FIGS. 8, 9 that polarizability greater than or equal to 0.4 can be secured at the time when the concentration of an element having 4f electrons is set to less than or equal to about 25 at. %. In such a case, the condition for achieving the ultimate purpose of the present invention is satisfied.

TABLE 4

Polarizability

| Concentration of added X (%) | CoFe—Gd (X = Gd) | CoFe—Tb (X = Tb) | CoFe—Sm (X = Sm) | CoFe—Nd (X = Nd) |
|---|---|---|---|---|
| 0 | 0.40 | 0.40 | 0.40 | 0.40 |
| 5 | 0.49 | 0.54 | 0.57 | 0.56 |
| 10 | 0.52 | 0.59 | 0.62 | 0.57 |
| 15 | 0.50 | 0.59 | 0.62 | 0.57 |
| 20 | 0.45 | 0.49 | 0.55 | 0.48 |
| 25 | 0.40 | 0.40 | 0.40 | 0.40 |
| 30 | 0.36 | 0.32 | 0.33 | 0.35 |

TABLE 5

Polarizability

| Concentration of added X (%) | NiFe—Tb (X = Tb) | NiFe—Gd (X = Gd) | NiFe—Sm (X = Sm) | NiFe—Nd (X = Nd) |
|---|---|---|---|---|
| 0 | 0.40 | 0.40 | 0.40 | 0.40 |
| 5 | 0.55 | 0.58 | 0.57 | 0.53 |
| 10 | 0.56 | 0.59 | 0.61 | 0.59 |
| 15 | 0.52 | 0.56 | 0.57 | 0.59 |
| 20 | 0.48 | 0.51 | 0.52 | 0.53 |
| 25 | 0.40 | 0.40 | 0.40 | 0.40 |
| 30 | 0.36 | 0.39 | 0.35 | 0.36 |

In view of these results, it can be said that it is preferable to set the concentration of the element having 4f electrons to a range greater than or equal to 2 at. % and less than or equal to 25 at. %.

Figure 10:
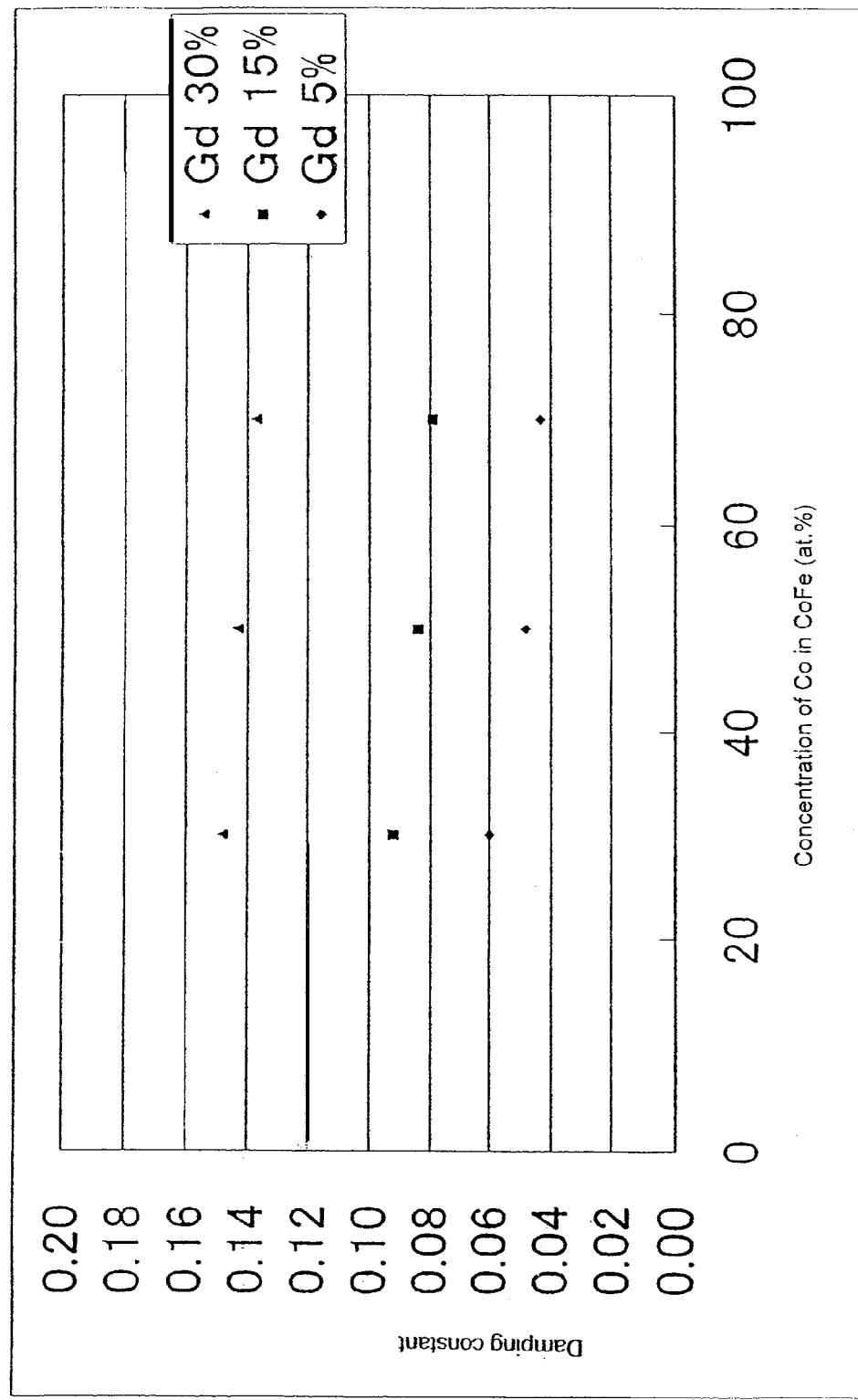
FIG. 10 is a graph showing the relationship between the composition of the magnetic body in the free layer of the MR element and the damping constant of the free layer.
Figure 11:
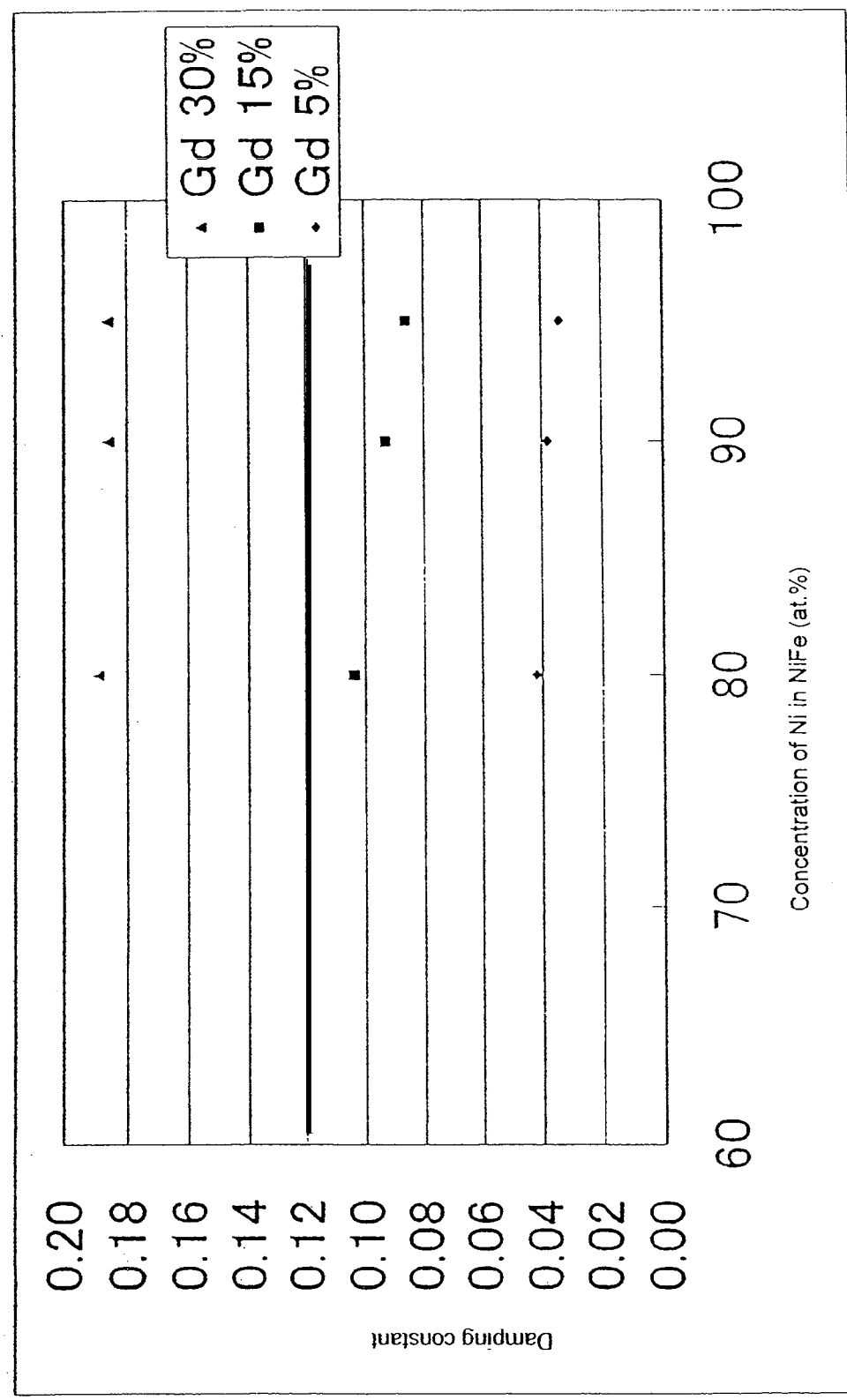
FIG. 11 is a graph showing the relationship between the composition of the magnetic body in the free layer of the MR element and the damping constant of the free layer.

Next, experiments about the influence of the composition of the magnetic body on damping constant α in the case where an element having 4f electrons is mixed into a magnetic body, are performed by taking Gd, CoFe and NiFe as examples, and the results of the experiments are shown in FIG. 10 and FIG. 11. It is seen from FIG. 10 and FIG. 11 that at least in the case where the concentration of Gd is set to 2 to 25 at. % as described above, as long as Co in CoFe is set to less than or equal to 70 at. % and Ni in NiFe is set to less than or equal to 95 at. %, the variation of damping constant α is small and the relationship: α>0.018 is secured. The damping constant of the free layer is increased by the existence of the element having 4f electrons as described above. Thus, as can be seen from the experimental example, it is conceivable that the damping constant is increased by adding an element having 4f electrons regardless of the composition of the magnetic body (CoFe, NiFe, and the like).

However, the composition of CoFe and NiFe is limited by another factor. That is, it is known that CoFe has a body-centered cubic lattice structure (bcc structure) at a concentration of Co less than or equal to 70 at. %. It has been found that the MR ratio is large when the free layer has the bcc structure. Therefore, it is preferable that the concentration of Co be set to greater than 0 at. % and less than or equal to 70 at. %. Further, it is known that NiFe exhibits negative magnetostriction in the range of concentration of Ni greater than or equal to 80 at. % and less than 100 at. %. It is preferable that Ni in NiFe be set to greater than or equal to 80 at. % and less than 100 at. % to allow cancellation of positive magnetostriction, that increased due to the bcc structure, by the negative magnetostriction.

Constitution of the free layer is not limited to the above described seven-layer constitution consisting of (CoFe—X)/(NiFe—X)/(CoFe—X)/Cu/(CoFe—X)/(NiFe—X)/(CoFe—X), but can be constituted in various ways. For example, it is conceivable to form the free layer by a multilayer constitution consisting of [(CoFe—X)/Cu]$_n$ and a multilayer constitution consisting of [(NiFe—X)/Cu]$_n$. In these constitutions, a Cu film is inserted in order to increase the interfacial polarizability, but Cu may be replaced by Au, Ag, Ru, Rh, Cr, Mn, Ir, V, Zn, Pd, Pt, Ta, or the like.

Further, as another example of a constitution, the free layer may also be formed by a three-layer constitution consisting of (CoFe—X)/Co$_2$MnSi or Co$_2$MnGe/(NiFe—X). In this case, the free layer may be constituted by laminating a CoFe—X film having a thickness of 1.0 nm, a Co$_2$MnSi film or Co$_2$MnGe film having a thickness of 4.0 nm, and a NiFe—X film having a thickness of 1.0 nm. Also in this case, X is an element having 4f electrons as represented by Nd, Sm, Gd, and Tb. As described above, it is preferable that the concentration of the element is set to 2 to 25 at. %. Further, it is preferable that the concentration of Co in CoFe be set to less than or equal to 70 at. % and that the concentration of Ni in NiFe be set to greater than or equal to 80 at. % and less than 100 at. %. In this constitution, $Co_2MnSi$ and $Co_2MnGe$ are Heusler alloys, and may also be replaced by a Heusler alloy having another composition. The Heusler alloy is expressed by a composition formula of $X_2YZ$ or XYZ (where X includes one or more of elements from among Cu, Co, Ni, Rh, Pt, Au, Pd, Ir, Ru, Ag, Zn, Cd, and Fe, Y includes one or more of elements from among Mn, Fe, Ti, V, Zr, Nb, Hf, Ta, Cr, Co, and Ni, and Z includes one or more of elements from among Al, Sn, In, Sb, Ga, Si, Ge, Pb, and Zn). If the Heusler alloy is directly formed on Cu of spacer layer 44, excellent film growth cannot be expected. However, in the above described constitution, CoFe—X is interposed between Cu and the Heusler alloy, and hence free layer 45 can be excellently formed. Further, it is known that an excellent MR ratio can be obtained by using the Heusler alloy for free layer 45, as in the above described constitution (see Japanese Patent Application Laid-Open No. 2003-218428).

As described above, in the case where free layer 45 is formed to have a multilayer constitution, there are many interfaces between layers, and hence it is possible to effectively utilize the MR effect of the interfaces. Further, in view of the film growth, it is preferable that the Heusler alloy layer is not arranged at least at the position of free layer 45 of the multilayer constitution, which position is in contact with spacer layer 44, but it is preferable that a CoFe—X layer be arranged at the position.

Note that the CPP-GMR element to which the present invention is applied has been exemplified in the above description, but the present invention can be applied to MR elements of other types such as, for example, a TMR element.

[Head Gimbal Assembly and Hard-Disk Drive which Include Thin-Film Magnetic Head]

Figure 12:
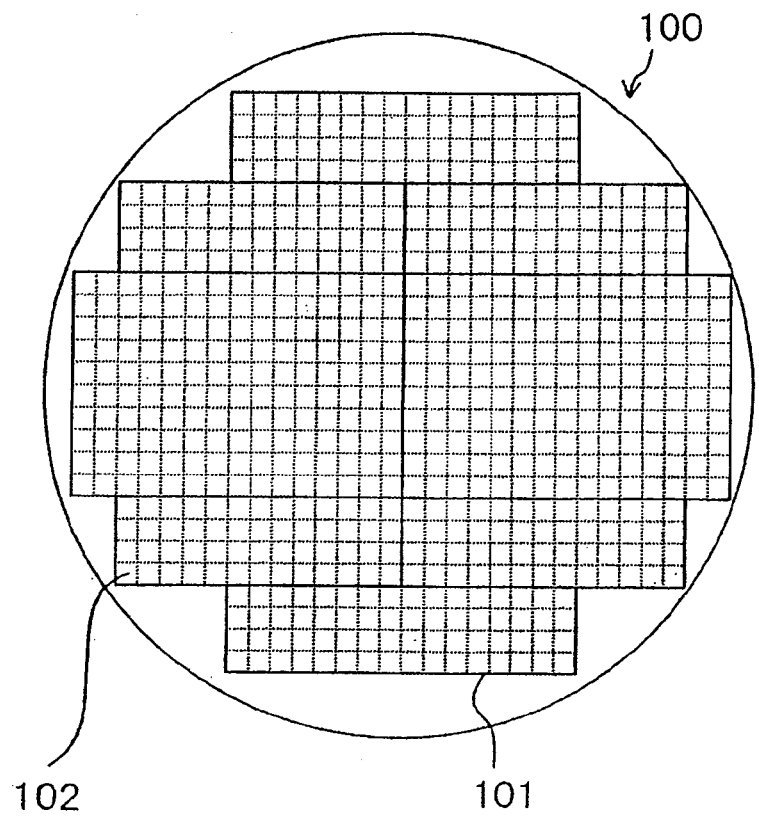
FIG. 12 is a plan view of an example of a wafer in which the thin film magnetic heads shown in FIG. 1 are formed.

Many thin-film magnetic heads 1 according to the present invention are formed in a single wafer. FIG. 12 shows a diagrammatic plan view of the wafer having many structures (substrates) that includes the thin-film magnetic head shown in FIG. 1 thereon.

Wafer 100 is divided into a plurality of head element aggregates 101 each including a plurality of head elements 102 each serving as a working unit for polishing surface S to face a recording medium of thin-film magnetic head 1 (see FIG. 1). Dicing portions (not shown) are provided between head element aggregates 101 and also provided between head elements 102. Head element 102 is a structure (substrate) including the structure of thin-film magnetic head 1, and becomes thin-film magnetic head 1 after having been subjected to necessary processing such as polishing to form surface S to face a recording medium. The polishing process is carried out generally on a plurality of head elements 102 which has been cut out into a row.

Figure 13:
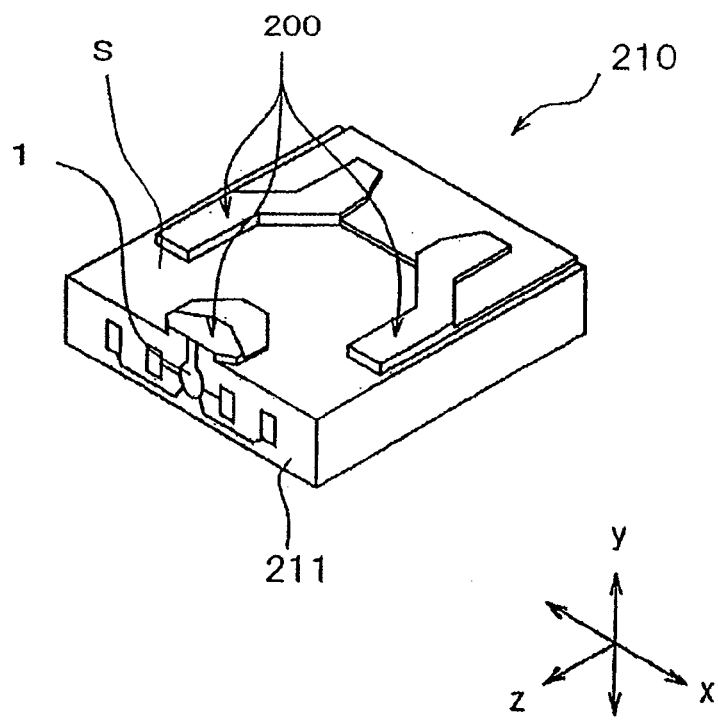
FIG. 13 is a perspective view of an example of a slider including the thin film magnetic head shown in FIG. 1.

A head gimbal assembly and a hard disk drive having the thin-film magnetic head according to the present invention will be described below. First, slider 210 included in the head gimbal assembly will be described below with reference to FIG. 13. In the hard disk drive, slider 210 is arranged opposite to a hard disk, which is a rotationally-driven disc-shaped recording medium. Slider 210 has thin-film magnetic head 1 obtained from head element 102 (see FIG. 12). Slider 210 has a substantially hexahedral shape in which surface S to face a recording medium is formed into an air bearing surface 200 which is positioned opposite to the hard disk. When the hard disk rotates in z direction in FIG. 13, an air stream passing between the hard disk and slider 210 applies a lifting force to slider 210 downward in a y direction. Slider 210 is lifted from the surface of the hard disk by the lifting force. X directions in FIG. 13 represent a direction transverse to the tracks of the hard disk. At end surface 211 on the outlet side of the airflow of slider 210, are electrode pads to input or output signals to/from reproducing unit 2 and recording unit 3 (see FIG. 1). Surface 211 is the upper end face in FIG. 1.

Head gimbal assembly 220 will be described below with reference to FIG. 14. Head gimbal assembly 220 has slider 210 and suspension 221 by which slider 210 is resiliently supported. Suspension 221 comprises load beam 222 in the form of a leaf spring made of stainless steel, for example, flexure 223 mounted on an end of load beam 222 for giving slider 210 an appropriate degree of freedom, slider 210 being joined to flexure 223, and base plate 224 mounted on the other end of load beam 222. Base plate 224 is mounted on arm 230 of an actuator for moving slider 210 in x directions transverse to the tracks of hard disk 262. The actuator has arm 230 and a voice-coil motor for moving arm 230. A gimbal for keeping slider 210 at a constant attitude is mounted on a portion of flexure 223 where slider 210 is installed.

Head gimbal assembly 220 is mounted on arm 230 of the actuator. A structure wherein head gimbal assembly 220 is mounted on single arm 230 is referred to as a head arm assembly. A structure wherein a carriage has a plurality of arms and head gimbal assembly 220 is mounted on each of the arms is referred to as a head stack assembly.

Figure 14:
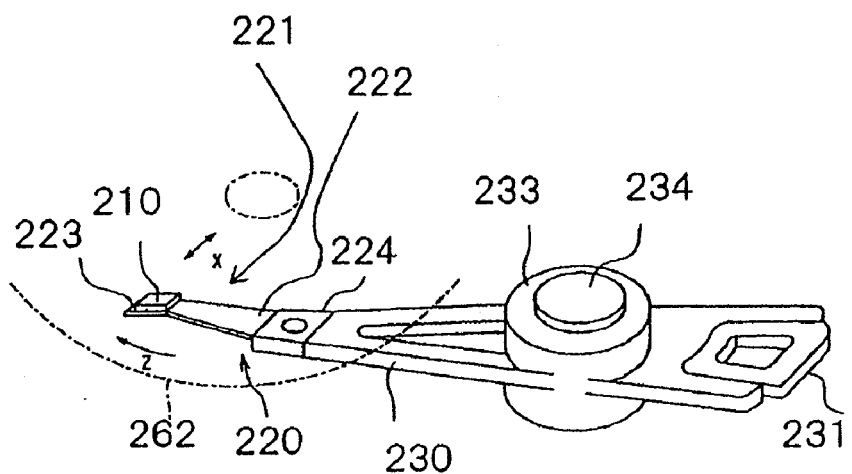
FIG. 14 is a perspective view of a head gimbal assembly including the slider shown in FIG. 13.

FIG. 14 shows a head arm assembly by way of example. In the head arm assembly, head gimbal assembly 220 is mounted on an end of arm 230. Coil 231 which is part of the voice-coil motor is mounted on the other end of arm 230. In the intermediate portion of arm 230, bearing 233 which is attached to shaft 234 for rotatably supporting arm 230 is provided.

Figure 15:
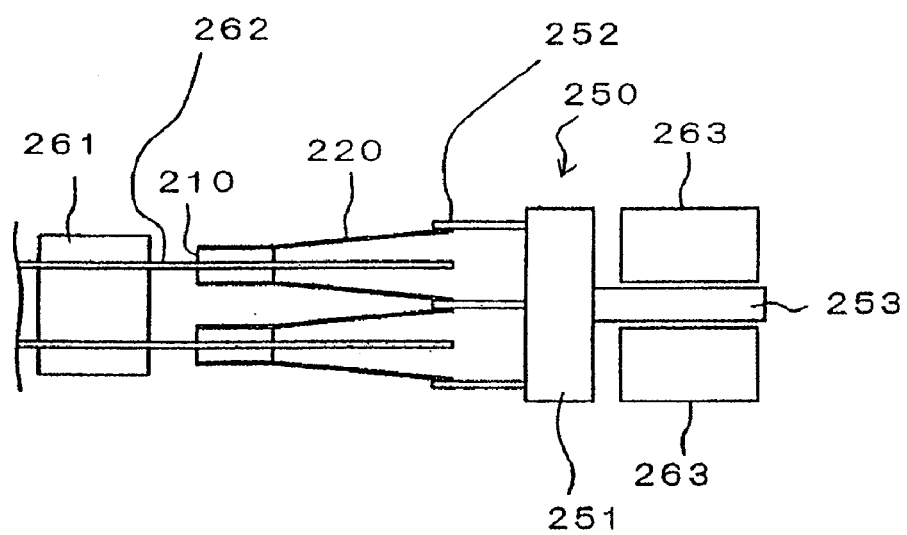
FIG. 15 is a side view of a major portion of a hard disk drive including the head gimbal assembly shown in FIG. 14.
Figure 16:
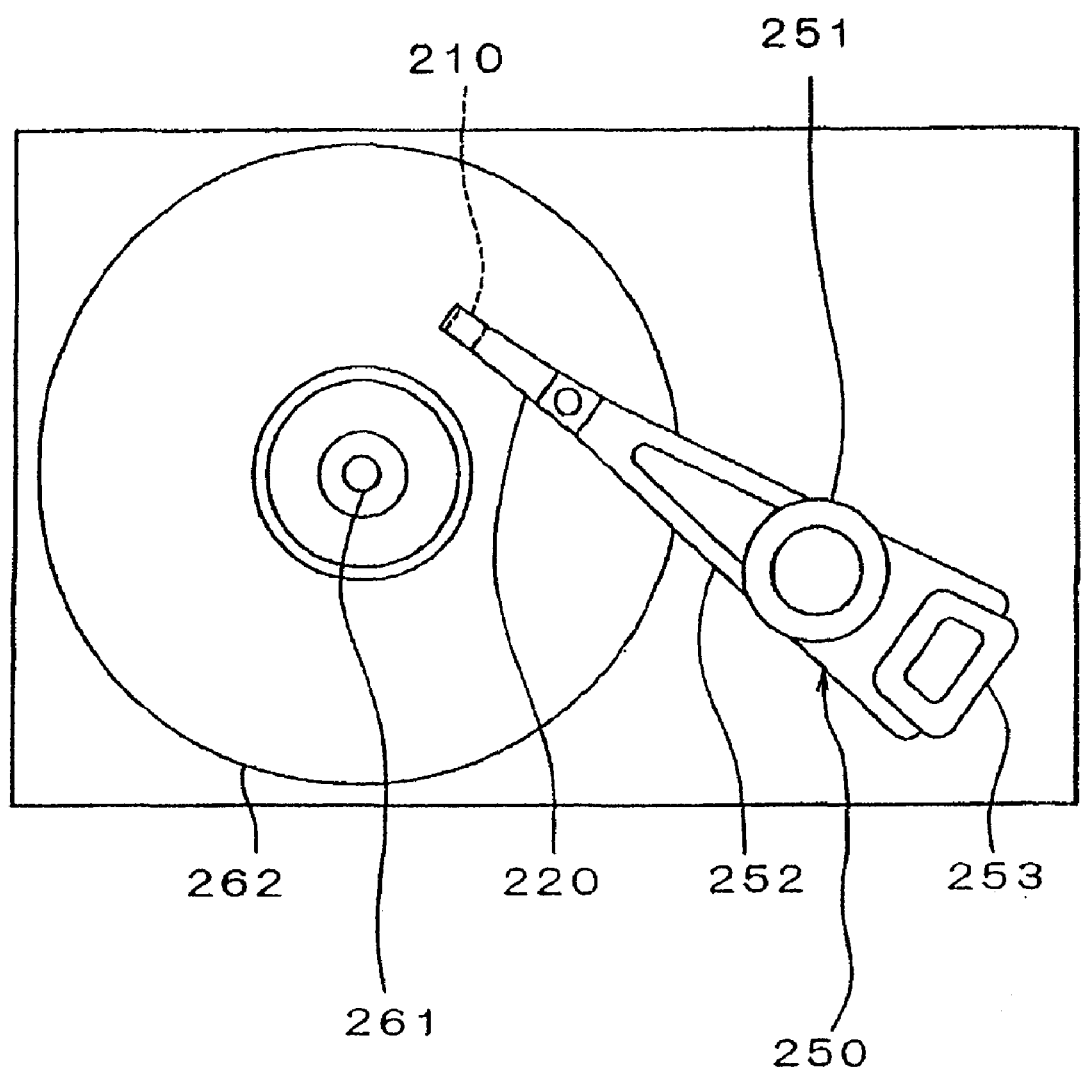
FIG. 16 is a plan view of the hard disk drive including the head gimbal assembly shown in FIG. 14.

A head stack assembly and a hard disk drive will be described below with reference to FIGS. 15 and 16. FIG. 15 is a view showing a major portion of a hard disk drive, and FIG. 16 is a plan view of the hard disk drive. Head stack assembly 250 has carriage 251 having a plurality of arms 252. A plurality of head gimbal assemblies 220 are attached to a plurality of arms 252 such that head gimbal assemblies 220 are arranged apart from each other in the vertical direction. Coil 253, which constitutes a part of the voice-coil motor, is attached to carriage 251 on the side opposite to arms 252. Head stack assembly 250 is installed in a hard disk drive. The hard disk drive has a plurality of hard disks (magnetic recording media) 262 mounted on spindle motor 261. Two sliders 210 are arranged at positions opposite to each other interposing hard disk 262 therebetween. The voice coil motor has permanent magnets 263 which are arranged in positions opposite to each other interposing coil 253 of head stack assembly 250 therebetween.

Head stack assembly 250, except sliders 210, and the actuator support sliders 210 and position sliders 210 with respect to hard disks 262.

In the hard disk drive, the actuator moves sliders 210 in directions transverse to the tracks of hard disks 262 and position sliders 210 with respect to hard disks 262. Thin-film magnetic heads 1 included in sliders 210 record information in hard disks 262 through recording unit 3, and reproduce information recorded in hard disks 262 through reproducing unit 2.

Thin-film magnetic head 1 is not limited to the above embodiments, but may be modified in various ways. For example, though thin-film magnetic head 1 that has a structure wherein reading MR element 4 is disposed near substrate 11 and writing induction-type electromagnetic transducer is stacked on MR element 4 has been described in the above embodiments, reading MR element 4 and the writing induction-type electromagnetic transducer may be switched around. Though a thin-film magnetic head having both an MR element 4 and an induction-type electromagnetic transducer has been described in the above embodiments, a thin-film magnetic head may have only an MR element 4.

While preferred embodiments of the present invention have been described using specific terms, such description is for illustrative purposes only, and it is to be understood that changes and variations may be made without departing from the spirit or scope of the following claims.

What is claimed is:

1. A magneto-resistance effect element comprising:
a pinned layer whose magnetization direction is fixed;
a free layer whose magnetization direction is changed according to an external magnetic field; and
a nonmagnetic spacer layer provided between said pinned layer and said free layer,
wherein said free layer has a multilayer constitution including a magnetic body mixed with an element having 4f electrons, and has a portion which is in contact with said spacer layer and which is made of a layer that includes CoFe and that includes an element having 4f electrons, and
wherein said magnetic body is a NiFe alloy including Nd and/or Sm as said element having 4f electrons, or a CoFe alloy including Nd and/or Sm as said element having 4f electrons.

2. A magneto-resistance effect element according to claim 1, wherein a ratio of Ni in said NiFe alloy is set to greater than or equal to 70 at. % and less than 100 at. %, and a ratio of Co in said CoFe alloy is set to greater than 0 at. % and less than or equal to 70 at. %.

3. A magneto-resistance effect element according to claim 1, wherein said element having 4f electrons is mixed into said magnetic body at a ratio greater than or equal to 2 at. % and less than or equal to 25 at. %.

4. A magneto-resistance effect element according to claim 1, wherein a damping constant of said free layer is greater than 0.018.

5. A thin film magnetic head comprising the magneto-resistance effect element according to claim 1.

6. A substrate comprising the thin film magnetic head according to claim 5.

7. A wafer to be used for manufacturing the substrate according to claim 6, comprising said thin film magnetic head.

8. A head gimbal assembly comprising:
a slider which includes the substrate according to claim 6 and which is arranged opposite a recording medium; and
a suspension to elastically support the slider.

9. A hard disk drive comprising:
a slider which includes the substrate according to claim 6 and which is arranged opposite a rotatably driven disc-shaped recording medium; and
a positioning device to support said slider and to position said slider with respect to said recording medium.

* * * * *